(12) United States Patent
Beierschmitt et al.

(10) Patent No.: US 10,114,057 B2
(45) Date of Patent: Oct. 30, 2018

(54) METHOD TO DETECT ARCING FAULTS USING SWITCHED ELEMENTS AT OUTLET

(71) Applicant: SCHNEIDER ELECTRIC USA, INC., Schaumburg, IL (US)

(72) Inventors: Joseph Beierschmitt, Marion, IA (US); Jeremy Schroeder, Urbana, IA (US)

(73) Assignee: Schneider Electric USA, Inc., Andover, MA (US)

( * ) Notice: Subject to any disclaimer, the term of this patent is extended or adjusted under 35 U.S.C. 154(b) by 209 days.

(21) Appl. No.: 14/898,776

(22) PCT Filed: Jun. 21, 2013

(86) PCT No.: PCT/US2013/047037
§ 371 (c)(1),
(2) Date: Dec. 16, 2015

(87) PCT Pub. No.: WO2014/204485
PCT Pub. Date: Dec. 24, 2014

(65) Prior Publication Data
US 2016/0202304 A1  Jul. 14, 2016

(51) Int. Cl.
*G01R 31/02* (2006.01)
*H02H 3/08* (2006.01)
(Continued)

(52) U.S. Cl.
CPC ......... *G01R 31/024* (2013.01); *G01R 31/025* (2013.01); *H02H 1/0015* (2013.01);
(Continued)

(58) Field of Classification Search
CPC ............ H02H 9/30; H02H 3/16; H02H 3/162; H02H 31/025; H02H 3/33
(Continued)

(56) References Cited

U.S. PATENT DOCUMENTS

| 5,699,051 A | 12/1997 | Billig et al. |
| 6,621,669 B1 | 9/2003 | Haun et al. |

(Continued)

FOREIGN PATENT DOCUMENTS

| EP | 0978918 B1 | 1/2008 |
| RU | 2311699 C2 | 11/2007 |

(Continued)

OTHER PUBLICATIONS

English Language Machine Translation of Russian Patent Publication No. RU2311699C2, dated Nov. 27, 2007, 11 pages.
(Continued)

*Primary Examiner* — Dharti Patel
(74) *Attorney, Agent, or Firm* — Locke Lord LLP (57) ABSTRACT

A system and method to detect arc faults in branch wiring. The system includes a line conductor and a neutral conductor. A circuit breaker is connected to an alternating current source via the line and neutral conductors. Electrical outlet devices are coupled to the circuit breaker via the line and neutral conductors. Each of the electrical outlet devices has a neutral shorting switching element coupled between the line and neutral conductors, and a load control switching element in the line conductor. The electrical outlet devices also each include an outlet controller to control the switching elements. The outlet controllers close the neutral shorting switching elements and the master controller determines if high impedance is present to detect a series arc fault. The outlet controllers open the load control switching elements and the master controller determines if any current is flowing on the line conductor to detect a parallel arc fault.

21 Claims, 4 Drawing Sheets

(51) Int. Cl.
*H02H 3/16* (2006.01)
*H02H 3/20* (2006.01)
*H02H 1/00* (2006.01)
*H02H 3/10* (2006.01)
*H02H 7/26* (2006.01)

(52) U.S. Cl.
CPC ............... *H02H 3/08* (2013.01); *H02H 3/10* (2013.01); *H02H 3/16* (2013.01); *H02H 3/20* (2013.01); *H02H 7/26* (2013.01)

(58) Field of Classification Search
USPC .............................................. 361/2–6, 42–49
See application file for complete search history.

(56) References Cited

U.S. PATENT DOCUMENTS

| | | | |
|---|---|---|---|
| 7,366,622 B1* | 4/2008 | Nemir | G01R 31/1272 361/2 |
| 8,374,729 B2 | 2/2013 | Chapel et al. | |
| 8,542,021 B2* | 9/2013 | Scott | H02H 1/0015 324/509 |
| 8,599,523 B1* | 12/2013 | Ostrovsky | G01R 31/025 361/45 |
| 2003/0156367 A1 | 8/2003 | Macbeth | |
| 2004/0136125 A1* | 7/2004 | Nemir | H02H 1/0015 361/42 |
| 2005/0286184 A1 | 12/2005 | Campolo | |
| 2008/0122447 A1 | 5/2008 | Montgomery et al. | |
| 2008/0169824 A1 | 7/2008 | DeHaven | |
| 2010/0157486 A1* | 6/2010 | Parker | H02H 1/0015 361/2 |
| 2011/0109301 A1 | 5/2011 | Johnson et al. | |
| 2013/0128396 A1* | 5/2013 | Danesh | G01R 19/00 361/45 |

FOREIGN PATENT DOCUMENTS

| | | |
|---|---|---|
| RU | 117686 U1 | 6/2012 |
| WO | WO2008/146040 | 12/2008 |
| WO | WO2012/116722 | 9/2012 |

OTHER PUBLICATIONS

English Language Machine Translation of Abstract and Claims of Russian Patent Publication No. RU117686U1,dated Jun. 27, 2012, 2 pages.
Search Report from Russian Patent Application No. 2015152852, dated Jun. 9, 2017, 2 pages.
International Search Report and Written Opinion for PCT/US13/047037 dated Dec. 3, 2013, 17pp.
Extended European Search Report for EP Patent Application No. 13887244.5 dated Feb. 3, 2017, 9 pages.
Search Report of Chinese Patent Application No. 2013800776459 dated May 7, 2018, 2 pages.

* cited by examiner

| | 146A | 146B | 146C | 148A | 148B | 148C |
|---|---|---|---|---|---|---|
| Parallel fault check | open | open | open | open | open | open |
| Series fault check (Upstream Outlet A) | closed | open | open | open | open | open |
| Series fault check (Outlet A to Outlet B) | open | closed | open | open | open | open |
| Series fault check (Outlet B to Outlet C) | open | open | closed | open | open | open |

FIG. 4

METHOD TO DETECT ARCING FAULTS USING SWITCHED ELEMENTS AT OUTLET

TECHNICAL FIELD

The present disclosure relates generally to fault detection in an electrical system and more specifically to arc fault detection on branch wiring through switched elements at an outlet.

BACKGROUND

Electrical outlets distribute power via a three socket connector having contacts connected to a line conductor, a neutral conductor and ground. Traditional circuit breakers protect against current surges or short circuits by detecting an overcurrent from downstream electrical outlets connected to branch wiring. The circuit breaker interrupts power via a trip mechanism when a current surge or short circuits are detected. Traditional circuit breakers cannot detect other faults such as arc faults which may occur in the outlet or wiring to the outlets, posing safety hazards. Thus, various other fault detection and protection devices are required for safety reasons in relation to electrical power distribution. For example, ground fault circuit interrupter (GFCI) outlets have been standard required equipment for a number of years. Such devices protect against faults occurring on the ground line. Additional protection is desired for other types of faults such as arc faults which occur on the line and neutral conductors. For example, arc fault detection is required in the form of an arc fault circuit interrupter (AFCI) device in outlets for safety reasons. Such devices detect current arc faults on the line and neutral conductors and cut off power before such arcs can cause an electrical fire. Such AFCI protected outlets provide protection against arcing thus decreasing the risk of electrical fires. AFCI devices must analyze arcs to determine whether the arc is a result of conventional use of an electrical outlet such as turning on a load device or whether the arc is a fault which could threaten to cause a fire.

Present AFCI devices perform arc fault detection by running a complicated probability based algorithm to detect whether a detected arc event constitutes a series or parallel arc fault in branch wiring downstream from the AFCI device. Some non-probability (impedance) based arc fault detection algorithms methods exist that require complete calibration to the circuit and load in a non-fault condition in memory for comparison with sensed values during the AFCI device operation. Algorithms detect any deviation from the calibrated values to determine whether an arc fault exists. With a probability based algorithm unwanted tripping caused by load incompatibility is an issue since such a load may fall outside of the calibrated values but may not be an arc fault. Intense troubleshooting is then required to determine if the trip was due to an actual arc fault or load incompatibility.

There is therefore a need for an AFCI device that detects arcing conditions with impedance measurement thus eliminating the need for a probability based algorithm and the associated troubleshooting between actual faults in branch wiring and potential load incompatibility. There is a further need for a system for arc detection using impedance measurement without the need for complete circuit calibration. There is also a need for an AFCI system that allows a user to detect the particular location of a series fault. There is also a need for an AFCI system that allows a user to detect parallel arc faults.

SUMMARY

One disclosed example is a system and method of detecting and locating branch wiring arc faults using voltage and current measurements at the origin of the branch. Switching elements at all branch end use device points such as electrical outlets, electrical receptacles, fixed lighting, etc. are used for detection of the arc fault. The detection system includes a circuit breaker with current and voltage sensors. The circuit breaker is connected to multiple outlets via a line conductor and a neutral conductor. Each of the outlets has line and neutral conductors therein and incorporates a neutral shorting switching element between the line and neutral conductor and a load control switching element on the line conductor. Under normal operation, the neutral shorting switching element is open and the load control switching element is closed and thus any load connected to outlet receives power and no current will flow through the neutral shorting switching element.

The circuit breaker is used in conjunction with the switching elements in the outlets which are opened and closed to determine whether series or parallel arc faults exist downstream from the circuit breaker. For parallel arc fault detection, the load control switching elements of all the outlets are momentarily opened and a current sensor on an upstream circuit breaker measures the current. Since all loads have been momentarily disconnected, any measured current is the result of a fault current, i.e. current is not accounted for and the circuit breaker will open.

For series arc fault detection, the neutral shorting switching elements of each outlet are momentarily closed and the current sensor and a voltage sensor of the upstream circuit breaker measures voltage and current. When the neutral shorting switching element is connected between the line and neutral conductor, a low impedance path is formed and the circuit breaker can calculate the resulting circuit's impedance. If the impedance is too large, a series fault is present and the circuit breaker will open. In addition to providing series fault detection, the location of series faults can be approximated by comparing the impedance measurements of each outlet.

The example electrical system allows detection of series and parallel arc faults in branch wiring connecting outlets. The system provides accurate detection of such faults thereby eliminating the need of probability based algorithms for arc fault detection in branch wiring. The present system does not require any calibration with circuit or loads for such an algorithm. The system allows for the determination of the location of a series arc fault. Finally, because the arc faults are detected using actual measurements, the probability of false tripping is reduced.

Additional aspects will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages of the invention will become apparent upon reading the following detailed description and upon reference to the drawings.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

On example disclosed is an electrical outlet device to detect branch arc faults. The electrical outlet device includes a line conductor and a neutral conductor. The line conductor and neutral conductor provide electrical power to a load connected to the electrical outlet device. A neutral shorting switching element is coupled between the line conductor and the neutral conductor. The neutral shorting element has an open position and a closed position, the closed position coupling the line conductor to the neutral conductor. A load control switching element is connected to the line conductor. The load control switching element has an open position and a closed position for controlling current through the line conductor. The neutral shorting switching element is in the open position and the load control switching element is in the closed position to provide power from the line conductor. An outlet controller is coupled to the switching elements. The outlet controller opens the load control switching element for a current sensor upstream of the electrical outlet device to determine whether a current is present on the line conductor to detect a parallel arc fault.

Another example is a method of determining arc faults downstream from a circuit breaker coupled to an alternating current power source via a line conductor and a neutral conductor. A load control switching element controlling current through the line conductor in a first outlet device downstream from the circuit breaker is opened. It is determined whether current is flowing on the line conductor. A parallel arc fault is detected based on whether current is flowing on the line conductor. A neutral shorting switching element in the first electrical outlet device is closed to couple the line conductor to the neutral conductor. The voltage between the line conductor and the neutral conductor is measured and the current flowing on the line conductor is measured to determine an impedance. A series arc fault is detected if the impedance exceeds a threshold value.

Another example is a system to detect arc faults. The system includes a line conductor and a neutral conductor. A circuit breaker is connected to the line and neutral conductors. A plurality of electrical outlet devices are each coupled to the circuit breaker via the line and neutral conductors. Each of the plurality of electrical outlet devices has a neutral shorting switching element coupled between the line and neutral conductors, and a load control switching element coupled to the line conductor. Each of the electrical outlet devices includes an outlet controller controlling the switching elements. The outlet controller closes the neutral shorting switching elements to detect a series arc fault and opens the load control switching element to detect a parallel arc fault.

Figure 1:
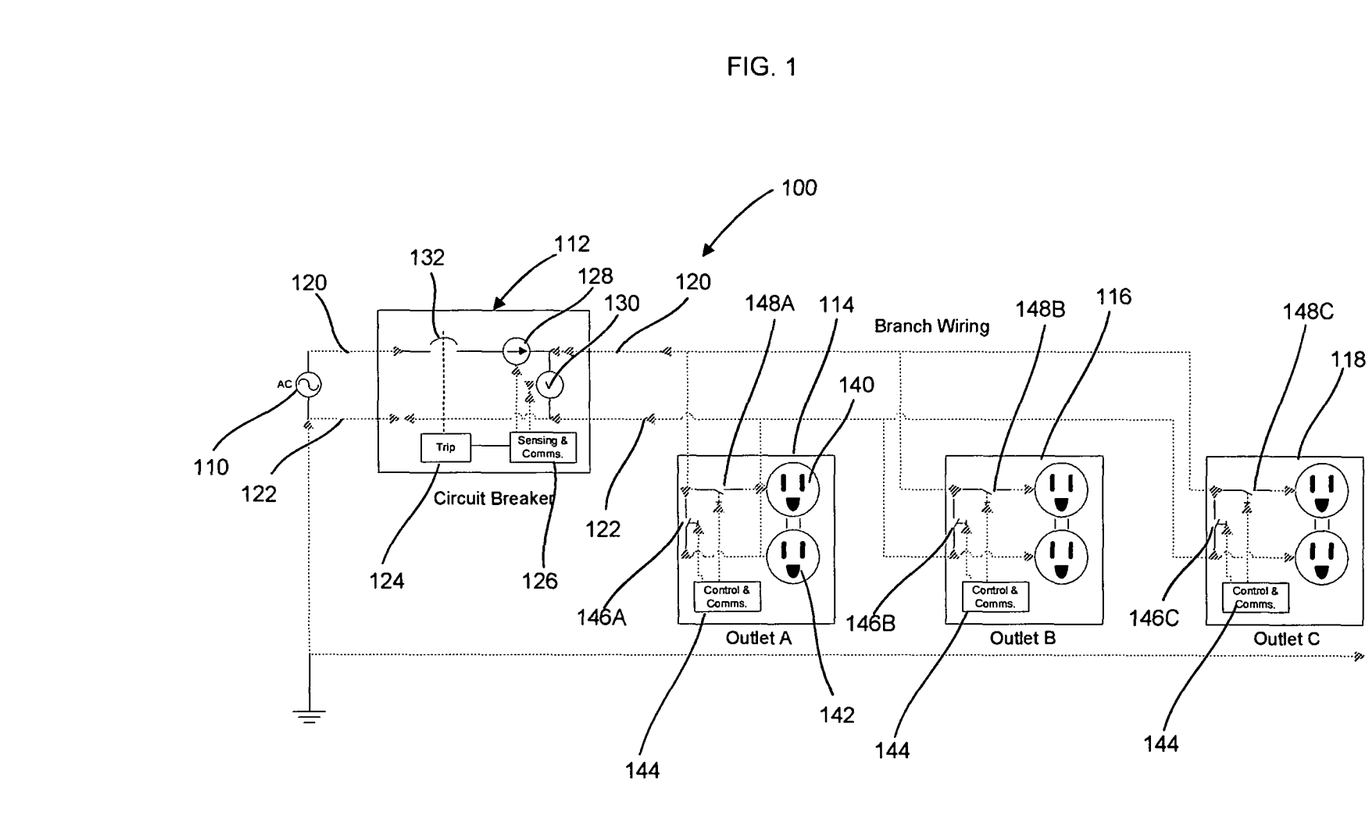
FIG. 1 is a circuit diagram of an arc fault protection system for electrical outlets.

FIG. 1 shows an arc fault detection system 100. The system 100 includes an AC power source 110 which may be a conventional 15-20 Amp power line to a building such as a residence. The arc fault detection system 100 includes a circuit breaker unit 112 and a series of downstream electrical outlets 114, 116 and 118 connected through branch wiring. Of course it is to be understood that there may be any number of outlets similar to the outlets 114, 116 and 118 in the system 100. In this example, the outlets 114, 116 and 118 are conventional three-prong power outlets which provide power when a load device is connected (plugged in). However, any electrical outlet device powered through the branch wiring may utilize the arc fault detection system 100. Additional electrical outlet devices besides the three-prong power outlets such as the outlet 114 may include electrical switches, electrical receptacles, lighting devices, etc. As is understood, the circuit breaker unit 112 is used to protect against short circuits and other overload situations from the outlets 114, 116 and 118 by interrupting power to the outlets in a case of an abnormal situation such as excessive current.

A line conductor 120 which may serve as the branch wiring couples the AC power source 110 to the circuit breaker unit 112 and the outlets 114, 116 and 118. A neutral conductor 122 also couples the AC power source 110 to the circuit breaker unit 112 and the outlets 114, 116 and 118. A ground line also couples the circuit breaker unit 112 to the outlets 114, 116 and 118.

The circuit breaker unit 112 includes conventional overcurrent detection capabilities as well as arc fault detection based on switching elements in the outlets 114, 116 and 118 as will be explained below. The circuit breaker unit 112 includes a trip controller 124, a master controller 126, a current sensor 128 and a voltage sensor 130. The trip controller 124 controls a trip mechanism 132 which when activated interrupts the flow of power in the line conductor 120. The trip mechanism 132 may be a relay through which power flows when the relay is closed and interrupts power when the relay is open. Of course other trip mechanisms may be used.

The current sensor 128 is coupled to sense current on the line conductor 120 and provide an output signal representative of the detected current on the line conductor 120 to the master controller 126. The voltage sensor 130 is coupled between the line conductor 120 and the neutral conductor 122 to provide the voltage between the line and neutral conductors 120 and 122. The voltage sensor 130 provides an output signal representative of the detected voltage between the line conductor 120 and neutral conductor 122 to the master controller 126. The master controller 126 uses the detected current and voltage to determine whether an overcurrent condition exists and controls the trip controller 124 to trigger the trip mechanism 132 when an abnormal condition is detected.

As will be explained below, each of the outlets 114, 116 and 118 in combination with the circuit breaker unit 112 provide arc fault detection and protection. For explanation purposes, attention is directed toward the outlet 114, although the outlets 116 and 118 operate in the same manner and contain identical components. The outlet 114 includes two electrical socket interfaces 140 and 142 which include three pronged sockets for electrical connection of a load device to the line conductor 120, neutral conductor 122 and ground. An outlet controller 144 controls the open and closed position of a neutral shorting switching element 146A and a load control switching element 148A. In this example, the switching elements 146A and 148A are solid state switches, although other either mechanical or solid state switching devices such as transistors, IGFETs, MOSFETS, etc. may be used. The neutral shorting switching element 146A is coupled between the line conductor 120 and the neutral conductor 122. When the neutral shorting switching element 146A is in a closed position, a connection is made between the line conductor 120 and the neutral conductor 122. Normally, the neutral shorting switching element 146A is in an open position to allow current to flow through a connected load device. The load control switching element 148A is coupled between the socket interfaces 140 and 142 to the line conductor 120. Thus, when the outlet 114 is operating normally, the load control switching element 148A is closed providing power to the cover interfaces 140 and 142 from the line conductor 120.

As shown in FIG. 1, the outlet 116 includes a similar neutral shorting switching element 146B coupled between the line conductor 120 and the neutral conductor 122. The outlet 116 also includes a load control switching element 148B on the line conductor 120 providing power to the socket interfaces 140 and 142. The outlet 116 includes a similar neutral shorting switching element 146C coupled between the line conductor 120 and the neutral conductor 122. The outlet 116 also includes a load control switching element 148C on the line conductor 120 providing power to the socket interfaces 140 and 142.

Figure 2:
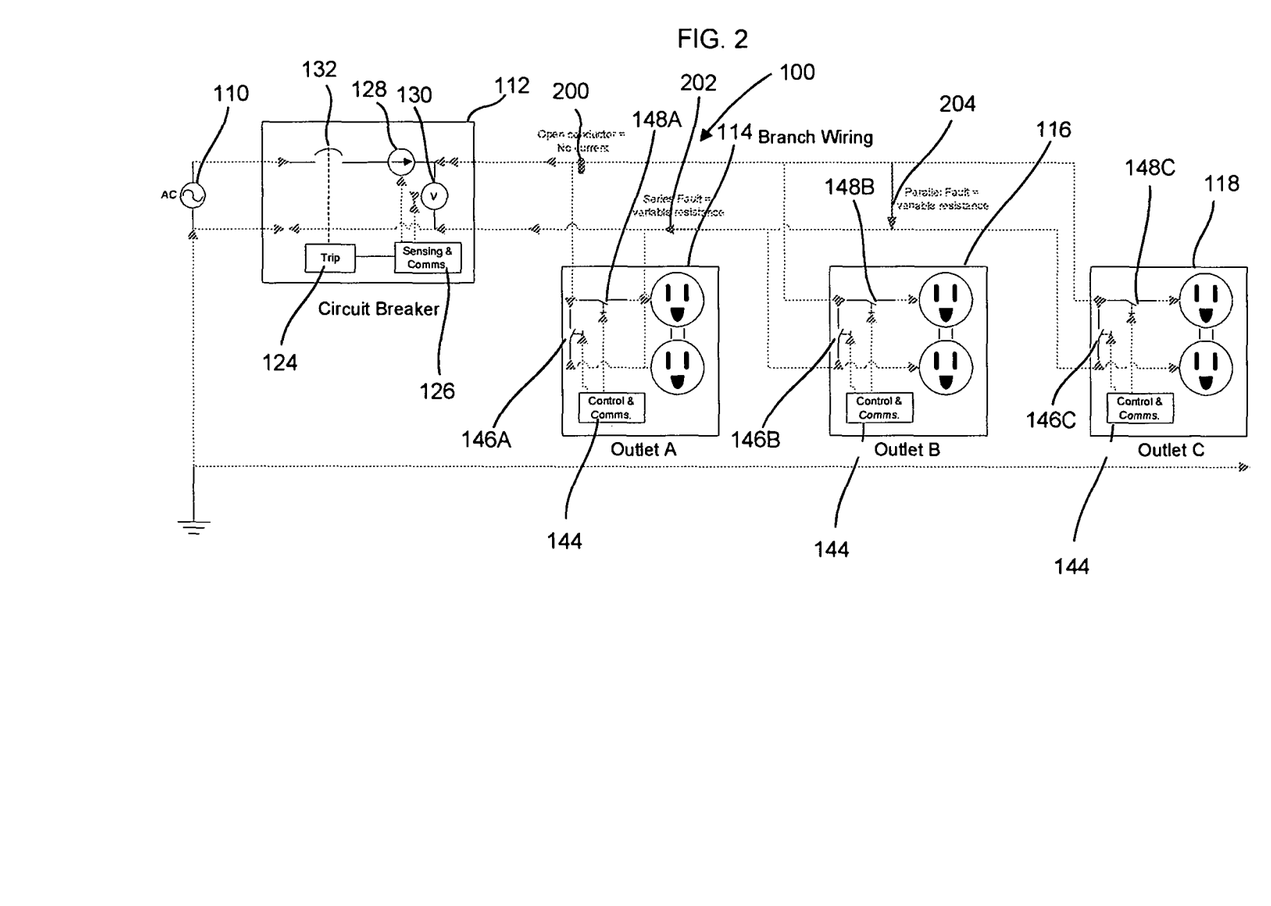
FIG. 2 is a circuit diagram showing the location of representative arc faults detected by the arc fault protection system in FIG. 1.

As will be explained in reference to FIG. 2, the system 100 performs arc fault detection and protection by opening and closing the switching elements 146A-C and 148A-C. Under normal operation, the neutral shorting switching elements 146A-C are open and the load control switching elements 148A-C are closed and thus current flows through any loads connected to any of the outlets 114, 116 and 118. No current will flow through the neutral shorting switching elements 146A-C under normal operating conditions. FIG. 2 shows common branch wiring fault conditions including an open current fault 200, a series arc fault 202 and a parallel arc fault 204 that may occur on the system 100. The circuit breaker unit 112 detects when an open conductor fault 200 exists on the line conductor 120 which results in no current being detected by the master controller 126. The master controller 126 then activates the trip controller 124 to open the trip mechanism 132 to interrupt current flow on the line conductor 120.

The parallel arc fault 204 may occur when an arc occurs between the line conductor 120 and the neutral conductor 122. Such an arc creates resistance by providing a path for current between the line conductor 120 and the neutral conductor 122. For parallel arc fault detection, the load control switching elements 148A-C of all outlets such as the outlets 114, 116 and 118 are momentarily opened and the upstream circuit breaker unit 112 measures the current on the line conductor 120 from the current sensor 128. Since all loads plugged into the outlets 114, 116 and 118 have been momentarily disconnected, any measured current is a fault current, i.e. current is not accounted for, and the master controller 126 of the circuit breaker unit 112 causes the trip mechanism 132 to open.

The series arc fault 202 may occur when an arc occurs on either the line conductor 120 or the neutral conductor 122. For series arc fault detection, the neutral shorting switching element 146A-C of each outlet 114, 116 and 118 is momentarily closed in sequence causing the line conductor 120 to be electrically connected to the neutral conductor 122. The upstream circuit breaker unit 112 measures current and voltage via the current and voltage sensors 128 and 130. When the neutral shorting switching elements 146A-C are individually closed, an electrical connection between the line and neutral conductors 120 and 122 forming a low impedance path through the respective outlet 114, 116, or 118. The master controller 126 of the circuit breaker unit 112 may calculate the resulting circuit's impedance from the measured current and voltage from the current and voltage sensors 128 and 130. If the circuit impedance is too large, a series arc fault is present such as the series arc fault 202 in FIG. 2 and the master controller 126 causes the trip mechanism 132 to open.

The switching of the neutral shorting switching elements 146A-C and the load control switching elements 148A-C occurs at a rate fast enough as to not affect load operation and the amount of time the switching elements interrupt power is short enough not to effect load operation. The switching elements 146A-C and 148A-C are controlled to open and close by the specific outlet controller such as the outlet controller 144 of the outlet 114. Alternatively, the outlet controller 144 may be in communication with the master controller 126 of the circuit breaker unit 112 and thus the control of the switching elements 146A-C and 148A-C may be centralized. In this example, the switching cycle for the switching elements 146A-C and 148A-C occurs at a frequency of once per second. Of course with higher current levels, a shorter frequency of time for a cycle such once per 60 ms may be used. The duration of each of the switching states is in the range of 1 ms in this example in order to insure that load operation is not interrupted.

Figure 3:
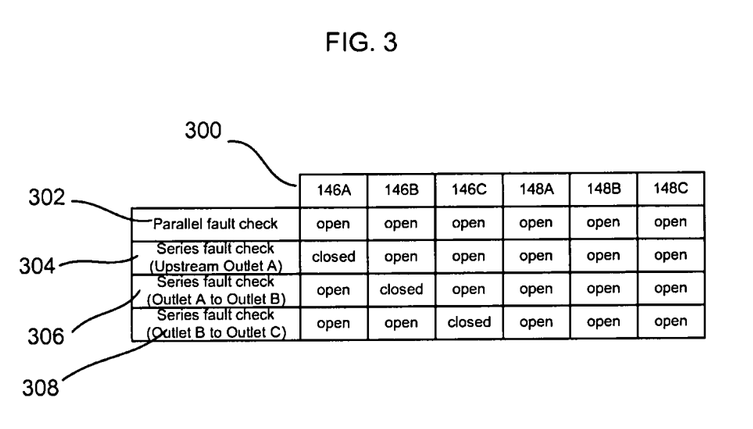
FIG. 3 is a state table for the process of detecting arc faults using the arc fault protection system in FIG. 1.

FIG. 3 is a state table showing the various states of the neutral shorting switching elements 146A-C and the load control switching elements 148A-C in the periodic arc detection cycle performed by the system 100 in FIG. 1. In the first part of the cycle, parallel arc faults are determined by opening all of the neutral shorting switching elements 146A-C and the load control switching elements 148A-C. The circuit breaker unit 112 determines whether any current is present on the line conductor 120 which indicates that a parallel arc fault such as the parallel arc fault 204 in FIG. 2 exists and triggers the trip mechanism 132 when the arc fault is detected.

The system then checks each outlet 114, 116 and 118 for series arc faults. During these subsequent checks, the load control switching elements 148A-C remain open. The neutral shorting switching element 146A is closed while the other two neutral shorting switching elements 146B-C remain open in order to determine whether a series arc fault exists upstream of the outlet 114. The circuit breaker unit 112 determines whether the calculated impedance from the measured voltage and current from the line conductor 120 exceeds a predetermined threshold value indicating a series arc fault upstream of the outlet 114. If such a fault is detected, the circuit breaker unit 112 trips the trip mechanism 132. The neutral shorting switching element 146B is then closed while the neutral shorting switching elements 146A and 146C are open in order to determine whether a series arc fault exists between the outlets 114 and 116. The circuit breaker unit 112 determines whether the calculated impedance from the measured voltage and current from the line conductor 120 exceeds a predetermined threshold value indicating a series arc fault between the outlet 114 and the outlet 116. If such a fault is detected, the circuit breaker unit 112 trips the trip mechanism 132. The neutral shorting switching element 146C is then closed while the neutral switching elements 146A and 146B are open in order to determine whether a series arc fault exists between the outlets 116 and 118. The circuit breaker unit 112 determines whether the calculated impedance from the measured voltage and current from the line conductor 120 exceeds a predetermined threshold value indicating a series arc fault between the outlet 116 and the outlet 118. If such a fault is detected, the circuit breaker unit 112 trips the trip mechanism 132.

Thus, in addition to providing fault detection, the location of series arc faults can be approximated by comparing the impedance measurements of each outlet 114, 116 and 118 as the load control switching elements 148A-C are switched on and off in sequence. For example, in the case of a series fault such as the series arc fault 202 shown in FIG. 2 which occurs on the branch wiring between the outlets 114 and 116, when the neutral shorting switching element 146A is closed, the master controller 126 of the circuit breaker unit 112 will not sense a high voltage and therefore the calculated impedance will be low and within acceptable parameters. When the neutral shorting switching element 146B is closed, the master controller 126 of the circuit breaker unit 112, will sense a higher voltage drop based on the occurrence of the series arc fault 202 and the resulting calculated impedance will be higher than acceptable parameters. In this manner, it is determined that the series arc fault 202 occurs between the outlets 114 and 116.

The incorporation of the neutral shorting switching elements 146A-C and the load control switching elements 148A-C within an electrical outlet allows for coordinated arc fault protection between the outlets and the circuit breaker unit 112. The circuit breaker unit 112 is coordinated with the operation of the neutral shorting switching elements 146A-C and load control switching elements 148A-C in all coupled outlets for the purpose of detecting branch arcing faults. Alternatively, the neutral shorting switching element and the load control switching element and a controller similar to the outlet controller 222 in FIG. 2 for controlling the switching elements may be part of a modular unit that may be connected to a conventional three prong electrical outlet or other existing electrical outlet devices to provide arc fault protection based on the process described above.

The load control switching elements 148A-C may also provide user load control at the respective outlets 114, 116 or 118 since the power to the outlet may be interrupted by opening the respective load control switching elements 148A-C. The neutral shorting switching elements 146A-C and load control switching 148A-C may be controlled strictly off line by frequency timing and thus no control communication between the outlet controllers 144 of the outlets and master controller 126 of the circuit breaker unit 112 is necessary. Zero crossings of the power signal on the line conductor 120 could be used to synchronize all outlets such as the outlets 114, 116 and 118 to open and close the respective switching elements 146A-C and 148A-C.

Alternatively, the master controller 126 of the circuit breaker 112 may serve as a switch controller to all the outlet controllers 144 on the outlets 114, 116 and 118. Communications could occur via wired connections, wireless communication or a power line carrier to designate the sequence of closing the switching elements on each of the outlets 114, 116 and 118.

The advantages of the system 100 include performing fault detection in branch wiring while avoiding the use of probabilistic detection algorithms since a definitive measurement of voltage and current is provided at the circuit breaker unit 112. The system 100 results in better arc fault detection with better nuisance tripping avoidance than a probabilistic detection algorithm. The system may be incorporated in "Efficient Homes" applications since it allows informing customers of a voltage drop at end use devices and enhanced load control based on series arc fault detection at the specific outlet from the neutral shorting switching elements at each outlet. The system could also be used as a troubleshooting tool informing a user of arc fault locations.

The controllers 126 and 144 may be a microprocessor, a processor, an application specific integrated circuit (ASIC), a programmable logic controller (PLC), a programmable logic device (PLD), a field programmable logic device (FPLD), a field programmable gate array (FPGA), discrete logic, etc. or any other similar device. The controllers 126 and 144 may include a memory (not shown), which may include hardware, firmware, or tangible machine-readable storage media that store instructions and data for performing the operations described herein. Machine-readable storage media includes any mechanism that stores information and provides the information in a form readable by a machine. For example, machine-readable storage media includes read only memory (ROM), random access memory (RAM), magnetic disk storage media, optical storage media, flash memory, etc.

Figure 4:
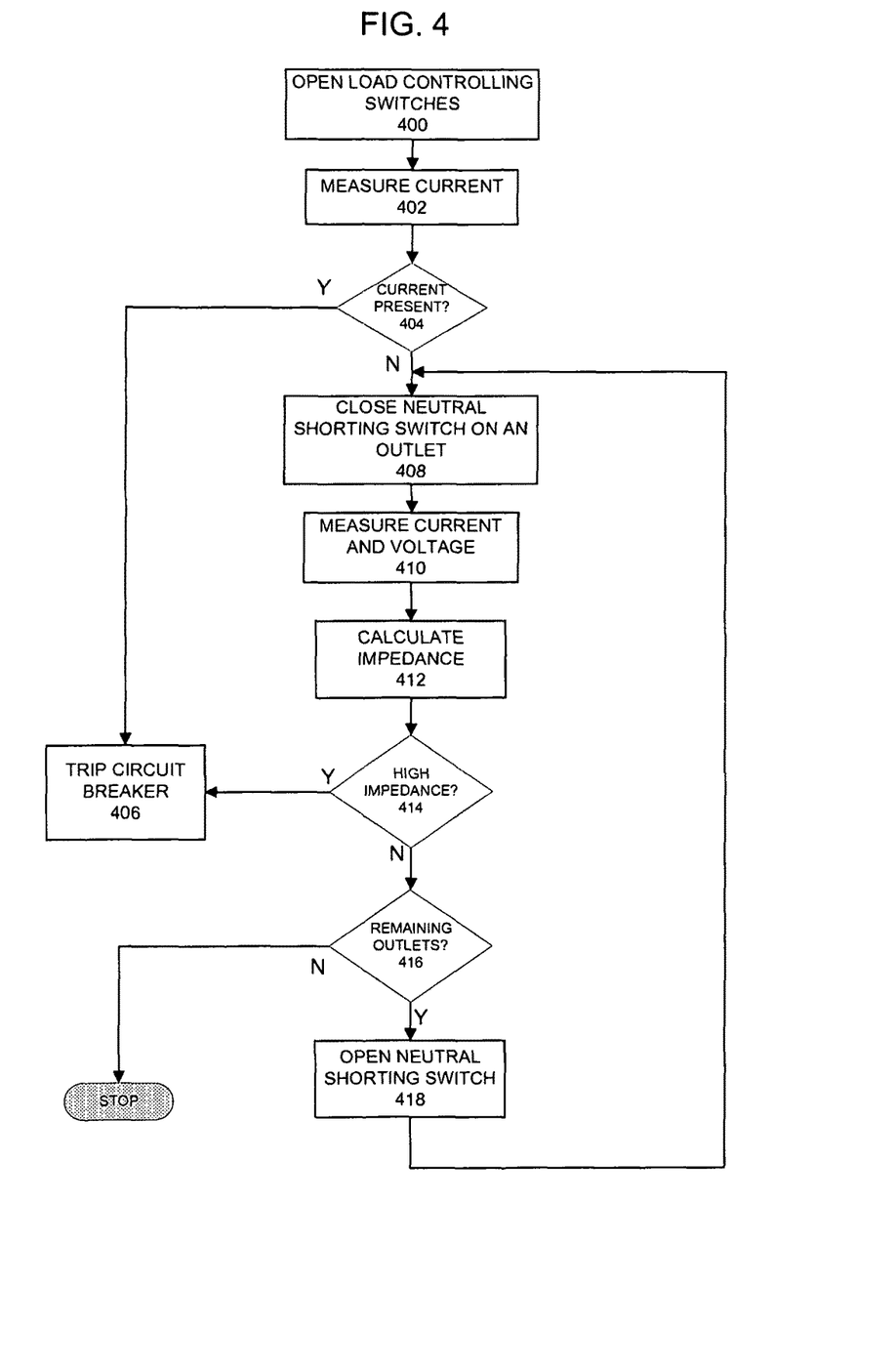
FIG. 4 is a flow diagram of the control algorithm executed by the controller to detect arc faults.

The operation of the example decision algorithm to detect and protect against an arc fault will now be described with reference to FIGS. 1-3 in conjunction with the flow diagram shown in FIG. 4. The flow diagram in FIG. 4 is representative of example machine-readable instructions for implementing the processes described above to detect and protect against arc faults. In this example, the machine readable instructions comprise an algorithm for execution by: (a) a processor, (b) a controller, or (c) one or more other suitable processing device(s). The algorithm can be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the controllers 126 and 144 in FIG. 1 could be implemented by software, hardware, and/or firmware. Further, although the example algorithm is described with reference to the flowchart illustrated in FIG. 4, persons of ordinary skill in the art will readily appreciate that other methods of implementing the example machine readable instructions might alternatively be used. For example, the order of execution of the blocks can be changed, and/or some of the blocks described can be changed, eliminated, or combined.

The algorithm in FIG. 4 is performed sequentially on a continual basis in the system 100 to check for occurrences of arc faults on branch wiring. The algorithm may be run by the master controller 126 alone in the circuit breaker unit 112 or in conjunction with the controllers 144 in the outlets 114, 116 and 118. The algorithm first opens the load control switching elements 148A-C of the outlets 114, 116 and 118 in FIG. 1 (400). The master controller 126 then measures the current from the current sensor 128 (402). If current is detected indicating a parallel arc fault, the controller 144 causes the trip mechanism 132 to be activated (406). If no current is detected, the algorithm proceeds to close the neutral shorting switching element 146A on a first outlet such as the outlet 114 (408).

The master controller 126 measures current from the current sensor 128 and voltage from the voltage sensor 130 (410). The master controller 126 calculates the impedance from the measured current and voltage (412). The master controller 126 then determines whether the impedance is high enough to exceed a threshold value indicating a series arc fault (414). If the calculated impedance is high enough, the master controller 126 causes the trip mechanism 132 to be activated (406). If the impedance is low, the master controller 126 determines whether every outlet downstream from the circuit breaker unit 112 has been checked (418). If there are no outlets remaining, the algorithm finishes. If there are additional outlets, the master controller 126 opens the previous shorting switching element and opens the shorting switching element of the next outlet such as the outlet 116 (408). The master controller 126 then proceeds to determine the impedance and thereby checks for additional series arc faults for each outlet downstream.

While the present invention has been described with reference to one or more particular embodiments, those skilled in the art will recognize that many changes can be made thereto without departing from the spirit and scope of the present invention. Each of these embodiments and obvious variations thereof is contemplated as falling within the spirit and scope of the claimed invention, which is set forth in the following claims.

What is claimed is:

1. An electrical outlet device to detect branch arc faults, comprising:
    a line conductor;
    a neutral conductor, the line conductor and neutral conductor to provide electrical power to a load connected to the electrical outlet device,
    a neutral shorting switching element coupled between the line conductor and the neutral conductor having an open position and a closed position, the closed position coupling the line conductor to the neutral conductor;
    a load control switching element in the line conductor, the load control switching element having an open position and a closed position for controlling current through the line conductor, wherein the neutral shorting switching element is in the open position and the load control switching element is in the closed position to provide power from the line conductor; and
    an outlet controller coupled to the neutral shorting switching element and the load control switching element, the outlet controller opening the load control switching element for a current sensor upstream of the electrical outlet device to determine whether a current is present on the line conductor to detect a parallel arc fault.

2. The electrical outlet device of claim 1, wherein a voltage sensor is coupled between the line conductor and the neutral conductor upstream of the outlet device and wherein the outlet controller closes the neutral shorting switching element to detect a series arc fault by determination of whether an impedance determined from the sensed voltage and current exceeds a threshold value.

3. The electrical outlet device of claim 2, wherein an upstream circuit breaker is coupled to the line conductor and neutral conductor, wherein if a fault is detected, the circuit breaker interrupts power on the line conductor.

4. The electrical outlet device of claim 3, wherein a master controller is coupled to the voltage sensor and current sensor in the circuit breaker.

5. The electrical outlet device of claim 2, wherein the neutral shorting switching element and the load control switching element are placed in the open and closed position by the outlet controller based on a periodic cycle.

6. The electrical outlet device of claim 5, wherein the frequency of the periodic cycle is a function of the magnitude of the current on the line conductor.

7. The electrical outlet device of claim 4, wherein the neutral shorting switching element and the load control switching element are placed in the open and closed positions under the control of the master controller communicating with the outlet controller.

8. The electrical outlet device of claim 4, wherein the master controller determines the location of the series arc fault by:
    opening the neutral shorting switching element of the electrical outlet device, and
    closing the neutral shorting switching element of a second electrical outlet device and determining whether an impedance from the sensed voltage and current exceeds a threshold value.

9. The electrical outlet device of claim 1, wherein the outlet controller is a microcontroller.

10. The electrical outlet device of claim 1, wherein the neutral shorting switching element and the load control switching element are solid state devices.

11. The electrical outlet device of clam 1, wherein the neutral shorting switching element and the load control switching element and outlet controller are in a module connected to a conventional outlet device including the line conductor and neutral conductor.

12. A method of determining arc faults downstream from a circuit breaker coupled to an alternating current power source via a line conductor and a neutral conductor, comprising:
    opening a load control switching element controlling current through the line conductor in a first electrical outlet device downstream from the circuit breaker;
    determining whether current is flowing on the line conductor;
    detecting a parallel arc fault based on whether current is flowing on the line conductor;
    closing a neutral shorting switching element in the first electrical outlet device to couple the line conductor to the neutral conductor;
    measuring the voltage between the line conductor and the neutral conductor and the current flowing on the line conductor to determine an impedance; and
    detecting a series arc fault if the impedance exceeds a threshold value.

13. The method of claim 12, further comprising interrupting the current to the line conductor via the circuit breaker when either the parallel arc fault or series arc fault is detected.

14. The method of claim 12, wherein the neutral shorting switching element and the load control switching. element are solid state devices.

15. The method of claim 12, further comprising:
    opening the neutral shorting switching element in the first electrical outlet device;
    closing a neutral shorting switching element in a second electrical outlet device downstream from the first electrical outlet device to disconnect the line conductor from a load coupled to the second electrical outlet device;

measuring the voltage between the line conductor and the neutral conductor and the current flowing on the line conductor to determine a second impedance; and determining the location of a series arc fault based on whether the determined impedances exceed the threshold value when the load control switching element of the first electrical outlet device is closed or when the load control switching element of the second electrical outlet device is closed.

16. The method of claim 15, further comprising opening a load control switching element in the second electrical outlet device controlling current through the line conductor in the second outlet electrical outlet device simultaneously with opening the load control switching element of the first electrical outlet device.

17. The method of claim 12, wherein the neutral shorting switching element and the load control switching element are opened and closed on a periodic cycle.

18. The method of claim 12, wherein the neutral shorting switching element and the load control switching element are opened and closed under the control of a master controller in the circuit breaker.

19. A system to detect arc faults, the system comprising:
a line conductor;
a neutral conductor;
a circuit breaker connected to the line and neutral conductors;
a plurality of electrical outlet devices each being coupled to the circuit breaker via the line and neutral conductors, each of the plurality of electrical outlet devices having a neutral shorting switching element coupled between the line and neutral conductors, and a load control switching element coupled to the line conductor, the plurality of electrical outlet devices each including an outlet controller controlling the neutral shorting switching element and the load control switching element, wherein the outlet controller closes the neutral shorting switching elements to detect a series arc fault and opens the load control switching element to detect a parallel arc fault.

20. The system of claim 19, wherein the circuit breaker includes a voltage sensor coupled between the line conductor and the neutral conductor, a current sensor coupled to the line conductor, and a master controller is coupled to the voltage and current sensors.

21. The system of claim 19, wherein the circuit breaker interrupts power on the line conductor if a parallel or series fault is detected.

* * * * *